(12) United States Patent
Terpstra et al.

(10) Patent No.: US 6,780,724 B2
(45) Date of Patent: Aug. 24, 2004

(54) METHOD OF MANUFACTURING A BIPOLAR TRANSISTOR SEMICONDUCTOR DEVICE

(75) Inventors: Doede Terpstra, Eindhoven (NL); Catharina Huberta Henrica Emons, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 155 days.

(21) Appl. No.: 10/069,893

(22) PCT Filed: Jun. 28, 2001

(86) PCT No.: PCT/EP01/07407
§ 371 (c)(1),
(2), (4) Date: Feb. 27, 2002

(87) PCT Pub. No.: WO02/03470
PCT Pub. Date: Jan. 10, 2002

(65) Prior Publication Data
US 2002/0123199 A1 Sep. 5, 2002

(30) Foreign Application Priority Data
Jul. 3, 2000 (EP) .............................................. 00202342

(51) Int. Cl.[7] ......................................... H01L 21/8222
(52) U.S. Cl. ...................................... 438/309; 438/322
(58) Field of Search ................................ 438/309, 312, 438/313, 322, 325

(56) References Cited

U.S. PATENT DOCUMENTS 5,204,274 A  *  4/1993  Kanda et al. ................ 438/322

* cited by examiner

*Primary Examiner*—Long Pham
*Assistant Examiner*—Vikki Hoa B. Trinh
(74) *Attorney, Agent, or Firm*—Peter Zawilski

(57) ABSTRACT

The invention relates to a method of manufacturing implanted-base, double polysilicon bipolar transistors whose emitter, base and collector are all situated in a single active area. In accordance with the method, first the island isolation (3) defining the active area (4) in the silicon body (1) is provided, which active area forms the collector (5). A first polysilicon layer (6) is deposited on the surface. A first part (6a) of poly I is p-type doped, a second part is n-type doped. By etching, two separate parts are formed from the first poly layer, one part being p-type doped and forming a base terminal (8), the other part being n-type doped and forming a collector terminal (9), said two parts being separated by an intermediate region (16) where the surface of the active area is exposed. The edges of these poly terminals and the exposed parts of the active area are provided with spacers (13, 15) and spacers (14, 16), respectively. After the provision of the intrinsic base region (11), a non-walled emitter (19) and the emitter terminal (18) in the form of an n-type doped second poly layer are provided in said intermediate region between the base and collector-terminals.

11 Claims, 12 Drawing Sheets

METHOD OF MANUFACTURING A BIPOLAR TRANSISTOR SEMICONDUCTOR DEVICE

BACKGROUND AND SUMMARY OF THE INVENTION

The invention relates to a method of manufacturing a semiconductor device, wherein a semiconductor body is provided, at a surface, with an isolation region which is recessed in the semiconductor body, which isolation region defines a continuous active region in the semiconductor body wherein a transistor having, adjacent to the surface, emitter and collector regions of a first conductivity type and abase region of the opposite, second conductivity type are formed, said emitter, base and collector regions each being provided with a contact region, for which purpose a fist silicon layer is deposited on the surface, from which silicon layer two of said three contact regions are formed, which are mutually separated by an intermediate region wherein the first semiconductor layer is removed, which intermediate region extends transversely over the length of the active region, whereafter a second silicon layer is deposited, which is electrically insulated from the first silicon layer, and from which second silicon layer the third contact region is formed at the location of the intermediate region between the two contact regions mentioned first. Such a method is disclosed, inter alia, in the patent document U.S. Pat. No. 5,204,274.

The above-mentioned first and second semiconductor layer are formed, in specific embodiments, by layers of doped polycrystalline silicon (poly). A transistor having very small dimensions can be manufactured by combining the emitter, base and collector terminals in a two-layer poly process with a design wherein the whole transistor, including the collector terminal, is accommodated in a single active region. Such a transistor has important advantages in, inter alia, high-frequency applications and/or very low power applications. The transistor may be embodied so as to be a discrete device or it may form part of an integrated circuit.

In the above-mentioned patent document U.S. Pat. No. 5,204,274, various embodiments of this type of transistors, as well as various methods for the manufacture thereof, are described. In a specific embodiment, shown in FIG. 2H in U.S. Pat. No. 5,204,274, the active region in the silicon body is circumferentially surrounded with a pattern of silicon oxide recessed in the body. An emitter contact and a collector contact are formed from the first semiconductor layer (doped poly), the emitter contact extending over a part of the active region adjoining the left-hand edge, and the collector contact extending over a part of the active region that is situated on the right-hand side. The emitter contact and the collector contact are both n-type contacts. In the intermediate region between these contacts, the p-type base contact is provided in the second poly. The emitter in the transistor thus obtained adjoins the recessed silicon oxide on three sides at the circumference of the active region. Customarily, it is desirable to provide the emitter at some distance from the silicon oxide, inter alia, to preclude a short-circuit between the emitter and the collector along the edge of the active region.

It is an object of the invention to provide, inter alia, a double poly transistor in a single active region, such that the emitter is situated at some distance from the edge of the active region. This object is achieved by a method of the type described in the opening paragraph which is characterized, in accordance with the invention, in that of the two contact regions formed from the first semiconductor layer, a first contact region, which is connected to the collector region, is doped with an impurity of the first conductivity type, and the other, the second, contact region, which is connected to the base region, is doped with an impurity of the second conductivity type, the semiconductor body being doped, after the removal of the first semiconductor layer in the intermediate region, with an impurity of the second conductivity type at the location of said intermediate region to form a part of the base region which forms an intrinsic base region, after which the second semiconductor layer is deposited, from which the emitter contact and the emitter region of the first conductivity type are formed, and, in a stage after the first semiconductor layer has been removed at the location of the intermediate region and before the second semiconductor layer is deposited, strips of an electrically insulating material separating the emitter region from the isolation region are formed at two opposite sides of the active region at the location where the intermediate region between the base contact and the collector contact is adjacent to the isolation region. By using the first poly layer to form the base and collector terminals, and providing these terminals on either side of the active region, and by forming additional strips of electrically insulating material at the edge of the active region in the intermediate region where the emitter will be formed, it is possible to provide the emitter in the center of the active region at some distance from the edges of the active region. Since the base terminals and the collector terminals are oppositely doped, these terminals could in principle form a continuous poly layer, the terminals being separated by a pin-junction or a pin-junction in the poly. Preferably, however, the base and collector terminals are arranged so as to be completely separated, so that no poly pn(pin)-junction is formed between these terminals. As a result, the leakage between the base and the collector can be kept small.

Various embodiments of the method in accordance with the invention are described in the dependent claims, with each embodiment having its own advantages dependent on the specific conditions wherein it is employed.

These and other aspects of the invention will be apparent from and elucidated with reference to the embodiment(s) described hereinafter.

DETAILED DESCRIPTION OF THE INVENTION

Figure 1:
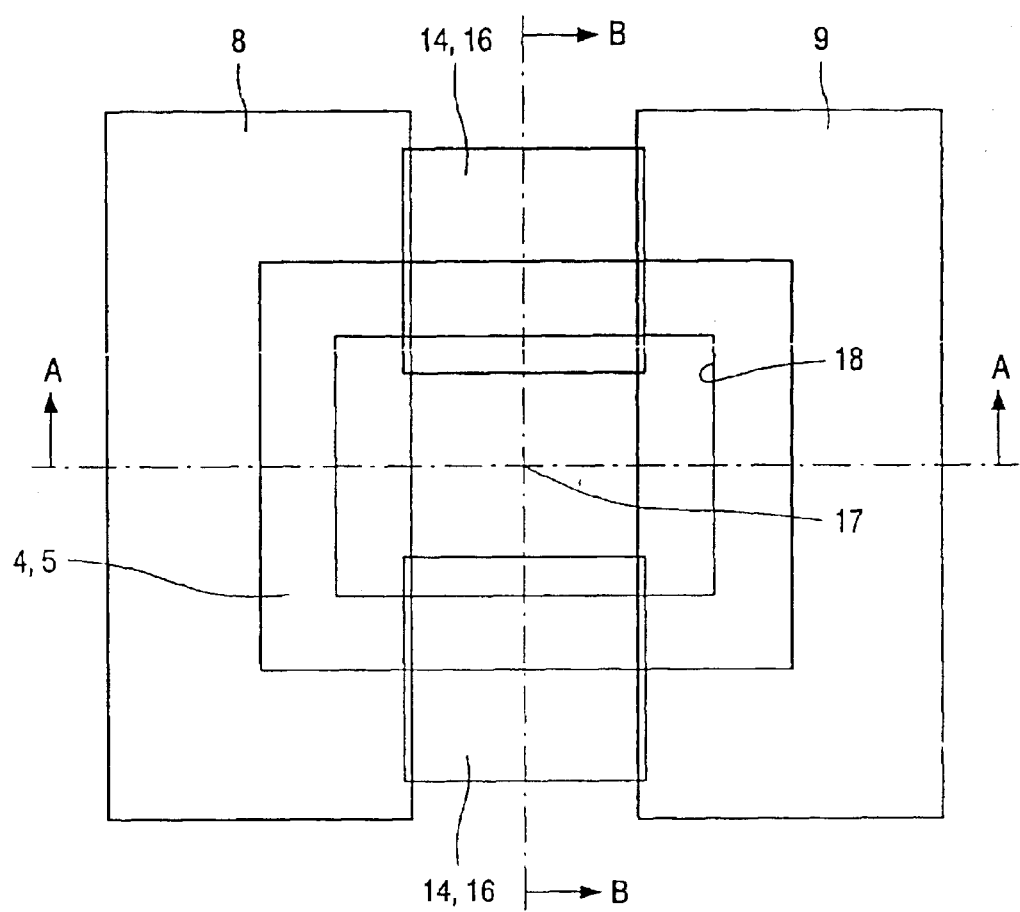
FIG. 1 is a plan view of a semiconductor device manufactured by using a method in accordance with the invention.

It is to be noted that the drawings are diagrammatic and not to scale. FIG. 2a, 3a, 4a and 5a are sectional views taken on the line A—A; FIG. 2b, 3b, 4b and 5b are sectional views of the device taken on the line B—B in FIG. 1.

To manufacture the device, use is made of a silicon semiconductor body comprising a p-type region 1 which adjoins a surface 2 and in which an active region 4 adjoining the surface 2 is defined by means of isolation regions 3. In this example, the isolation regions 3 are formed by a pattern of silicon oxide, which is obtained by masked oxidation of the silicon body 1 (locos). It will be clear that the regions 3 can alternatively be formed by grooves filled with a dielectric material. By means of implantation of, for example, arsenic or phosphor ions, an n-type collector 5 is formed in the active region, the lateral boundary of said collector coinciding completely or at least substantially completely with the edge of the active region 4. It is noted that within the scope of the invention, an implanted collector is not necessary. For example, the collector may alternatively be formed by an island-shaped part of an n-type epitaxial layer on a p-type substrate, said island being laterally separated from surrounding parts of the epitaxial layer by the isolation region. In this case, a highly doped n-type buried collector layer may be provided, if necessary, between the epitaxial layer and the substrate.

Figure 2A:
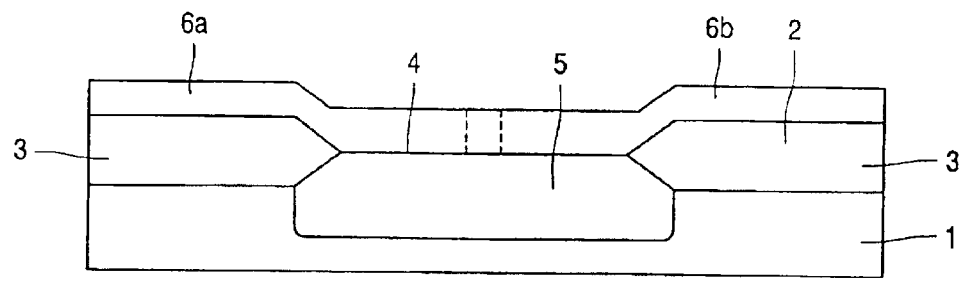
FIGS. 2 through 5 are sectional views of this device taken on the lines A—A and B—B in FIG. 1, in various stages of the manufacturing process.
Figure 2B:
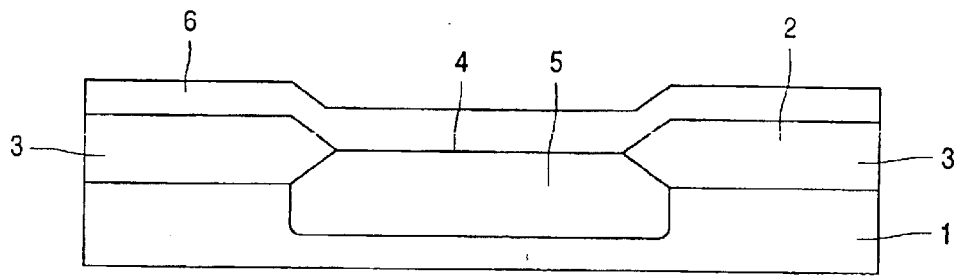

After the definition of the collector 5, the surface is covered with a first semiconductor layer 6, which is generally polycrystalline and, thus, will hereinafter be referred to as first poly layer or poly I. By means of two masks, this layer is doped with different dopants. In this example, the left-hand part 6a, which forms the base contact, is p-type doped with boron ions. The right-hand part of the poly I layer, referenced 6b, which forms the collector terminal and is conductively connected to the collector 5, is n-type doped by implantation of arsenic or phosphor ions. FIGS. 2a and 2b show this stage of the process.

Figure 3A:
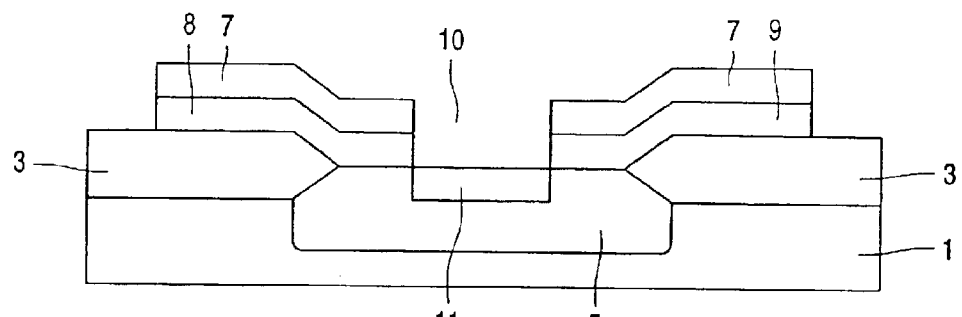

The poly layer 6 is subsequently covered with a dielectric layer, in this example a deposited silicon oxide layer 7. Next, a mask is provided in a customary manner, which defines the base terminal and the collector terminal in the poly layer. By means of etching, the pattern of the mask is subsequently transferred into the oxide layer 7 and into the poly layer 6, resulting in the formation of the p-type base contact 8 and the n-type collector contact 9 (FIG. 3a and FIG. 1). The contacts 8 and 9 are completely separated from each other, so that, in the absence of a pn-junction between these contacts in the poly layer, leakage currents between the contacts can be kept low. In the active region 4, the contacts 8 and 9 are separated by an intermediate region 10 which extends across the width of the active region, and in which the surface of the semiconductor body is exposed.

It is noted that, in this example, the structure of the transistor is symmetrical. It will be clear that this is not necessary and that also asymmetric configurations are possible within the scope of the invention.

Figure 3B:
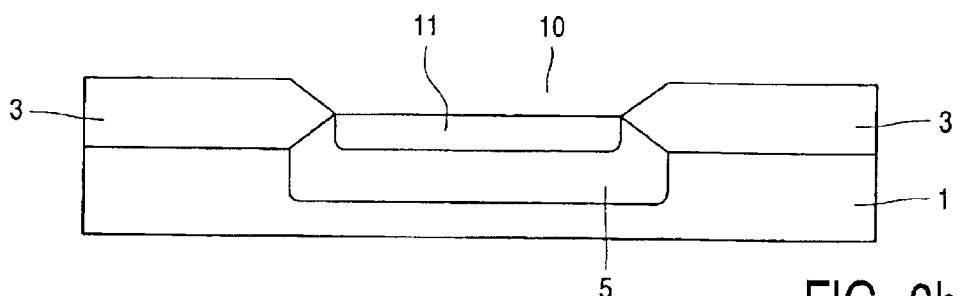
Figure 4A:
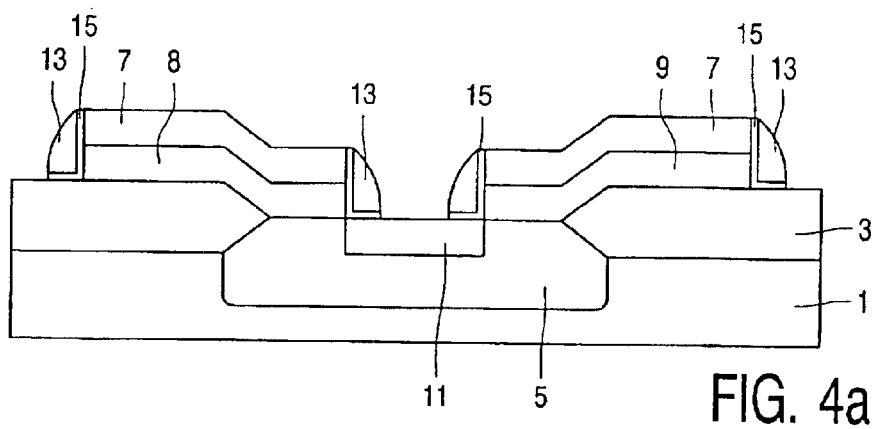
Figure 4B:
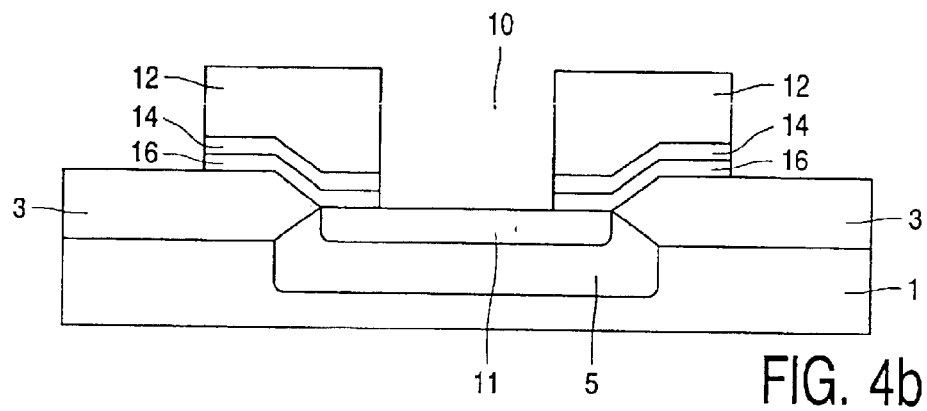
Figure 5A:
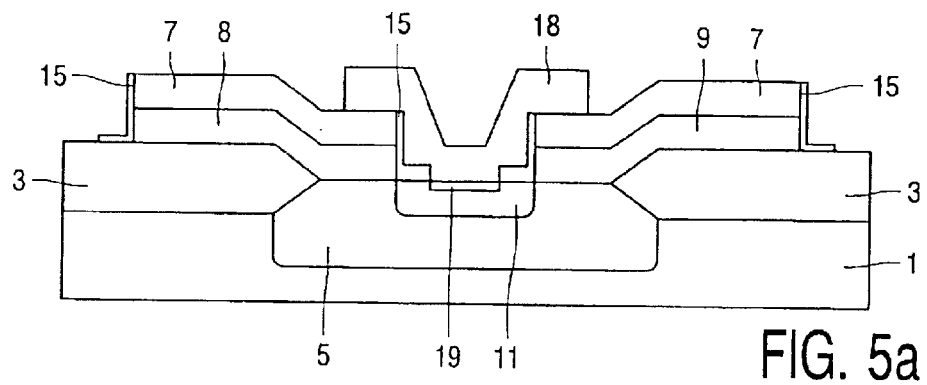
Figure 5B:
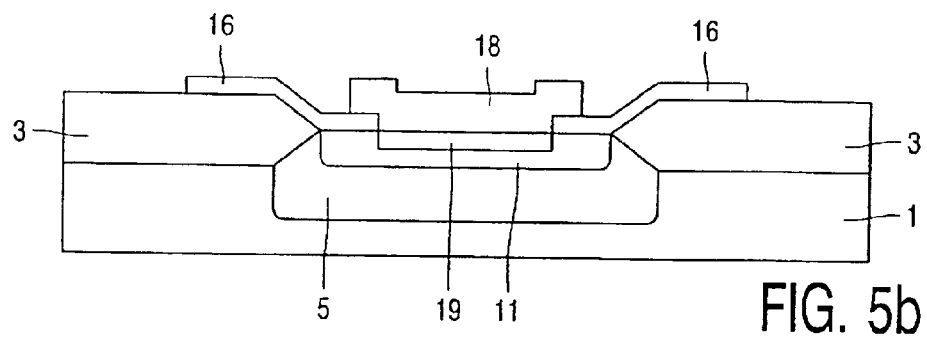

After poly I has been structured, the p-type base 11 can be provided in the intermediate region 10 in a self-aligned manner by implantation of boron ions. The base 11 is conductively connected to the p-type base contact 8. After the removal of the photomask (before or after said implantation), the situation as shown in FIG. 3a and FIG. 3b is obtained. In a next stage, the emitter-base spacers are formed having a generally known L-shape. For this purpose, first a first dielectric layer of a material which can be selectively etched with respect to silicon oxide, in this example a layer of silicon nitride, is provided, after which a second dielectric layer which can be selectively etched with respect to silicon nitride, in this example a layer of silicon oxide, is provided by deposition. The emitter is bounded in the direction of the line A—A FIG. 1 by the contacts 8 and 9; in order to also bound the emitter in the direction transverse to this line, i.e. in the direction of the line B—B in FIG. 1, first a mask 12 (FIG. 4b) is provided which overlaps the active region in the intermediate region 10. First, spacers 13 (FIG. 4a) are formed, from the oxide layer, along the edges of the base and collector contacts 8 and 9 by means of anisotropic etching. Underneath the mask 12, oxide layers 14 are formed, which overlap the active region 4. In a next step, the nitride layer is selectively etched using the oxide spacers 13 as a mask. As a result, L-shaped nitride spacers are formed along the edges of the contacts 8 and 9. Simultaneously, similar nitride spacers 16 are formed underneath the spacers 14. After etching the nitride, the oxide of the spacers 13 and 14 can be removed. In this stage, the emitter window 17 (FIG. 1) is defined, which is bounded in one direction by the poly I contacts 8 and 9 and, in the other direction, by the spacers 16, so that, along its entire circumference, it is situated at a distance from the recessed oxide 3.

After the formation of the spacers, the poly II layer is provided, which is n-type doped, and the emitter terminal 18 is customarily formed from said poly II layer (FIG. 5) in a photolithographic process. The n-type emitter 19 may extend over a small distance into the base 11 as a result of diffusion from the poly layer 18.

The device may further be subjected to customary process steps, which are not indicated herein, such as the provision of metal contacts and of passivation and anti-scratch layers, and embedding the device in an envelope.

The emitter is separated, along the entire circumference, from the edge of the active region 4 and from the oxide pattern 3, thereby precluding edge effects which adversely influence the operation of the transistor. The whole transistor is situated in a single, coherent active region and is made so as to comprise two poly layers enabling the connection of the emitter, the base and the collector. By virtue thereof, the dimensions of the transistor and hence, for example, capacitances may be very small, so that the transistor can be operated at a very low power and/or the transistor is suitable, inter alia, for operation at high frequencies, for example in the radio frequency range.

Figure 6A:
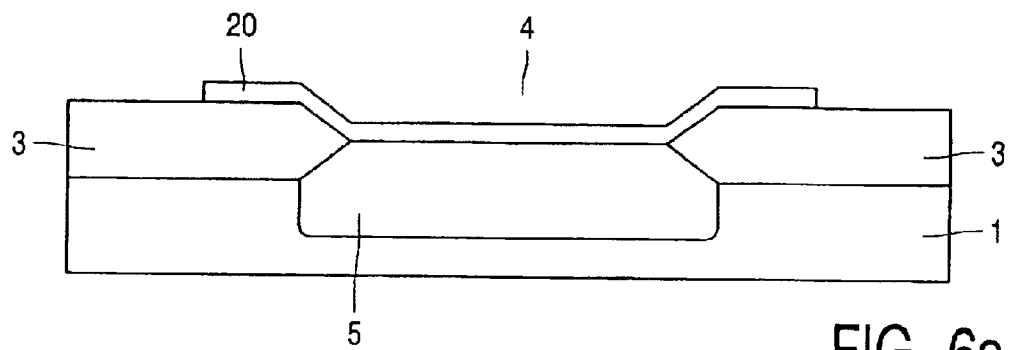
FIGS. 6 through 9 are sectional views of a modification of this device taken on the lines A—A and B—B in FIG. 1, in various stages of the manufacturing process.
Figure 6B:
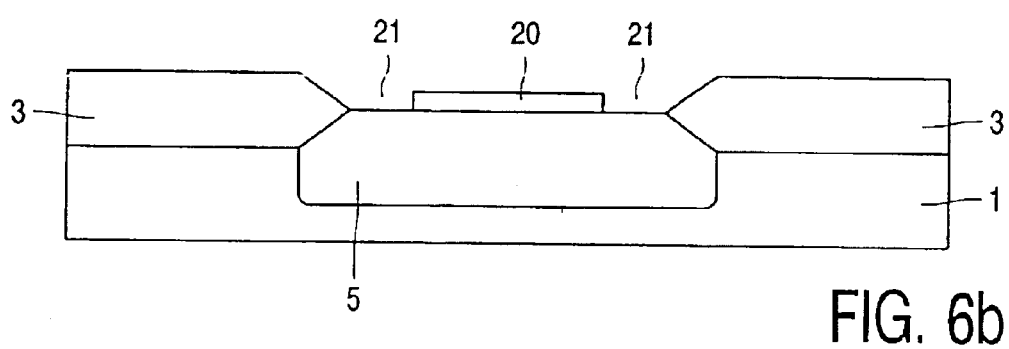
Figure 7A:
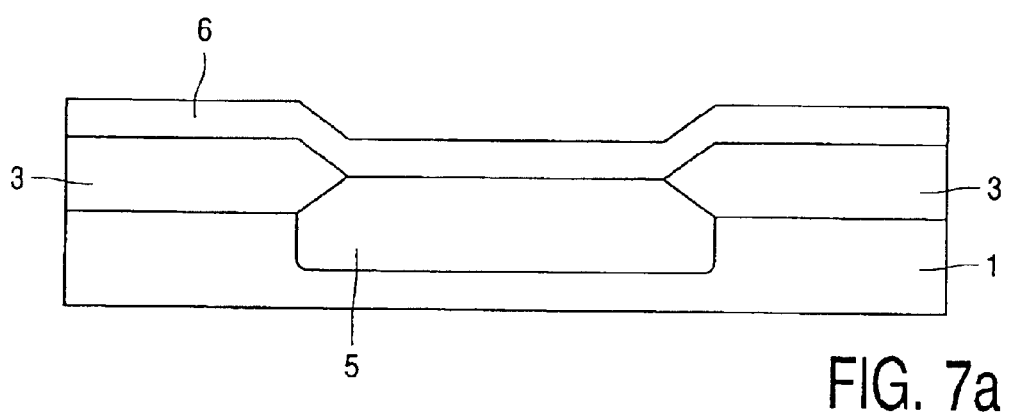
Figure 7B:
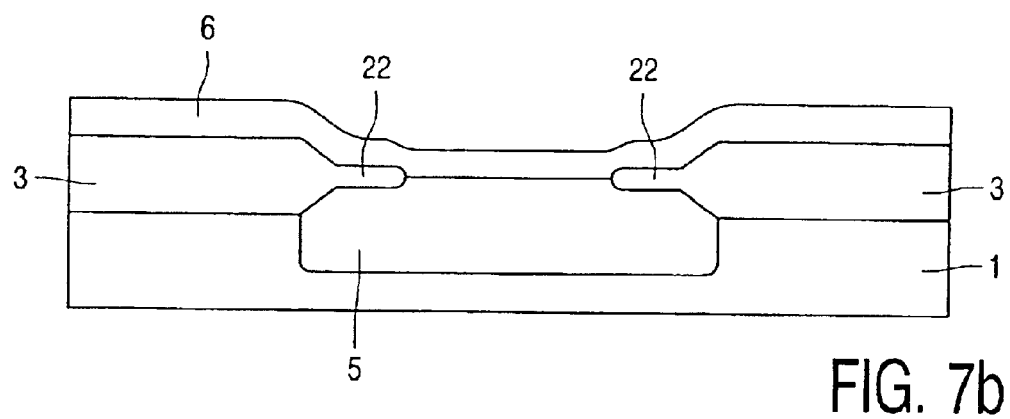
Figure 8A:
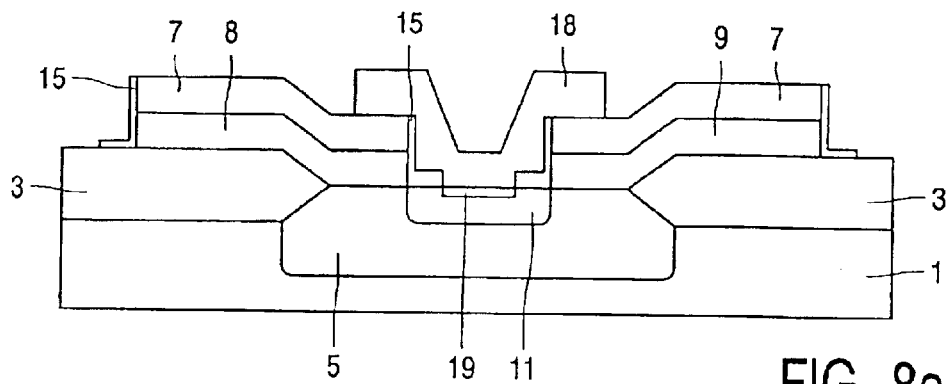
Figure 8B:
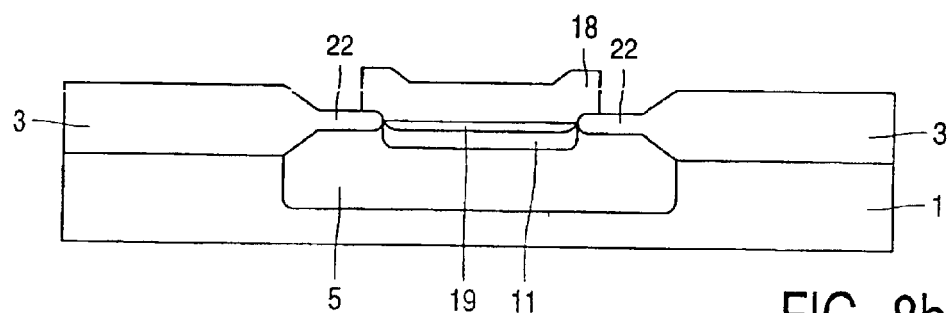

A modification of the method described herein is diagrammatically shown in FIGS. 6, 7 and 8. The Figures indexed a and b show, in the same way as in the previous example, sectional views taken on the lines A—A and B—B, respectively, in FIG. 1. FIG. 6 shows the situation wherein the active region is defined by the locos pattern 3 in the semiconductor body 1 and wherein the collector 5 is formed in the active region by an n-type implantation. Next, a mask 20 is provided on the surface, which mask protects the underlying silicon against oxidation. The mask 20, which is shown as a single layer in the drawing for the sake of simplicity, may comprise a layer of silicon nitride, which is known per se, and, if necessary, an underlying layer of silicon oxide. The mask 20 largely covers the active region, leaving only two strips 21 (FIG. 6b) exposed at the edge of the active region, where the spacers must be formed between the emitter to be formed and the locos. By means of thermal oxidation, oxide layers 22 (FIG. 7b) are formed, at the location of the strips 21, in a thickness which is much smaller than the thickness of the oxide pattern 3. The layers 22 fulfill the same function as the spacers 16 in the previous example. After the oxidation step and after removal of the mask 21, the poly I layer 6 is provided, see FIGS. 7a and 7b. Subsequently, the same process steps as in the preceding example are carried out, with this difference that the mask 12, see FIG. 4b, used in the first example to define the spacers 16 is not used in this case. The ultimately obtained structure is shown in FIG. 8a and FIG. 8b. The double-poly transistor obtained comprises, also in this case, a single active region which is circumferentially surrounded by the field oxide 3. The base terminal and the collector terminal are formed by, respectively, a p-type poly path 8, which is conductively connected to the p-type base 11, and an n-type poly path 9, which is conductively connected to the n-type collector 5, said poly paths 8 and 9 both being manufactured from the first poly layer. The emitter terminal 18 is formed by an n-type poly path, which is conductively connected to the n-type emitter 19 and manufactured from the second poly layer. The emitter 19 is laterally separated from the field oxide 3 by spacers 22 which, in this example, are formed by strips of silicon oxide, which are obtained by masked oxidation of the silicon surface. As the spacers 22 are provided before the base is formed, also the base 11 can be laterally bounded, so that, at least in one direction, also the base 11 is situated at a distance from the field oxide 3, as shown in FIG. 8b. By virtue thereof, the capacitance between the base and the collector can be limited very advantageously.

Figure 9A:
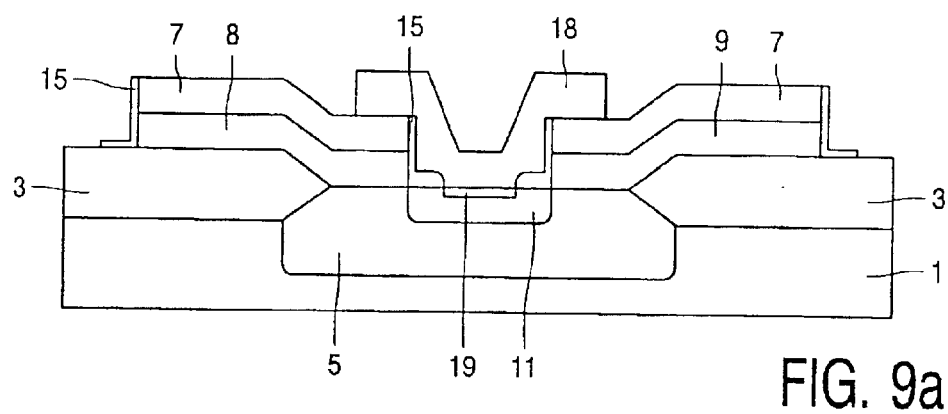
Figure 9B:
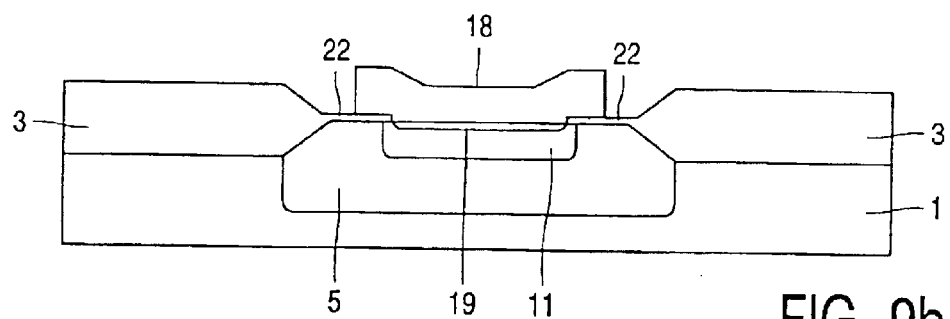

A modification of this embodiment is shown in FIG. 9. In this modification, the spacers 22 in the intermediate region are not formed by oxide obtained by thermal oxidation of the surface of the silicon body 1, but instead by oxide formed by deposition on the surface. This oxide layer is deposited after the intermediate region has been defined by forming the terminals 8 and 9 in the first poly layer, and before the base implantation is carried out. After the deposition process, the spacers 22 can be formed in this oxide layer at the edge of the field oxide 3 by means of photolithography, whereafter the base implantation and further, above-described process steps can be carried out.

A further embodiment of a method in accordance with the invention will now be described with reference to FIGS. 10 to 15. It is noted that the plan view of FIG. 10 particularly shows the relative position of various masks that are to be used successively. There is started from the situation shown in FIG. 11, where the active region 4 in the semiconductor body 1 is defined by means of shallow trench isolation, often abbreviated as STI, instead of by field oxide as in the preceding examples. In this further embodiment, the surface is provided with a groove, which is subsequently filled with an electrically insulating material, for example silicon oxide, resulting in the formation of a flat, or substantially flat, surface. If necessary, an n-type implantation can be carried out in the active region 4 in order to obtain the desired doping concentration in the collector 5. Subsequently, the first poly layer 6 is provided whose left half 6a is p-type doped and whose right half 6b is n-type doped for, respectively, the base terminal and the collector terminal of the transistor. The poly layer 6 is then covered with a layer 7 of silicon oxide. By means of a mask, a window 24 (FIG. 10) is formed in the layers 6, 7, which window defines the intrinsic base of the transistor. The window 24 is situated, omnilaterally, at a distance from the isolation 3. Next, a comparatively thick layer of, for example, silicon nitride is provided over the whole, which layer is removed down to the oxide layer 7 by means of CMP (Chemical-Mechanical Polishing) so that a plug 25 of silicon nitride is left behind in the window 24 (see FIG. 11).

Figure 10:
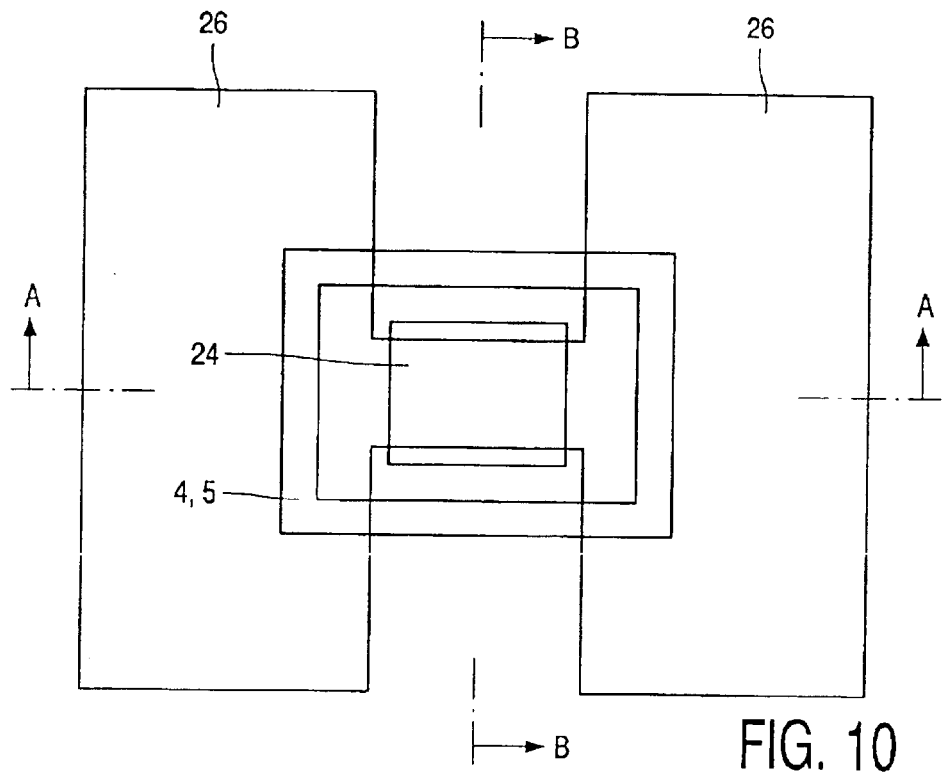
FIG. 10 is a plan view of a semiconductor device manufactured by using a different embodiment of a method in accordance with the invention.
Figure 11A:
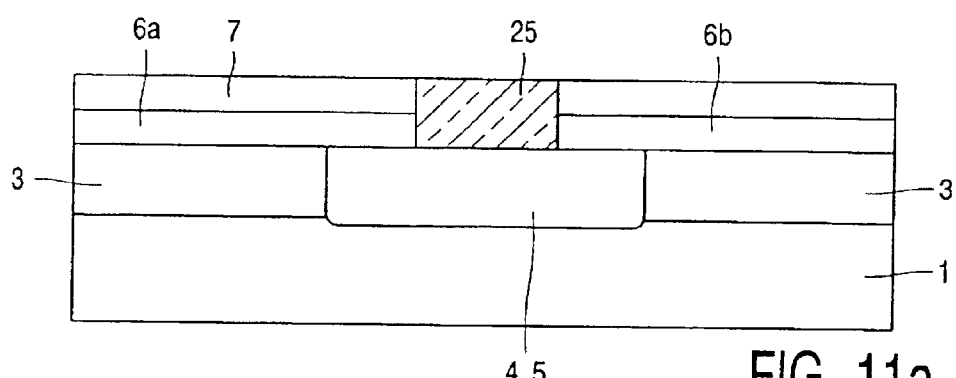
FIGS. 11 through 15 are sectional views of this device taken on the lines A—A and B—B in FIG. 10 in various stages of the manufacturing process.
Figure 11B:
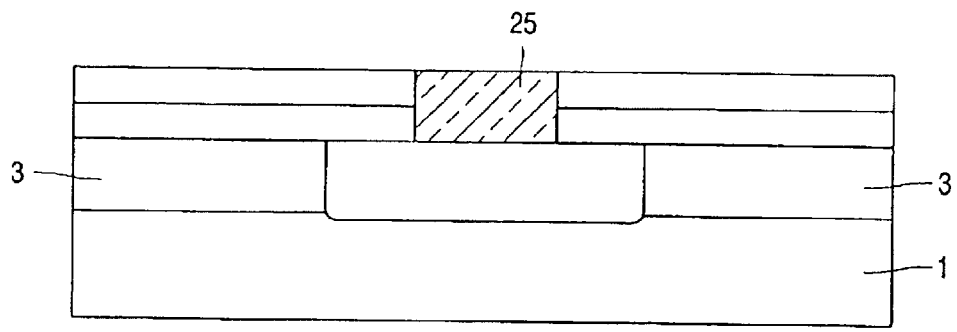

In a subsequent stage, the p-type base terminal 8 and the collector terminal 9 (FIG. 12) are formed in the first poly layer by means of the mask 26 (FIG. 10), in the same manner as in the preceding examples. As the mask 26 also leaves a part of the nitride exposed, as shown in FIG. 10, the poly layer 6 must be selectively etched with respect to nitride. The terminals 8 and 9 are mutually separated by an intermediate region 10, where the poly material is removed, and which region extends across the width of the active region and is partly filled with the nitride plug 25.

Figure 12A:
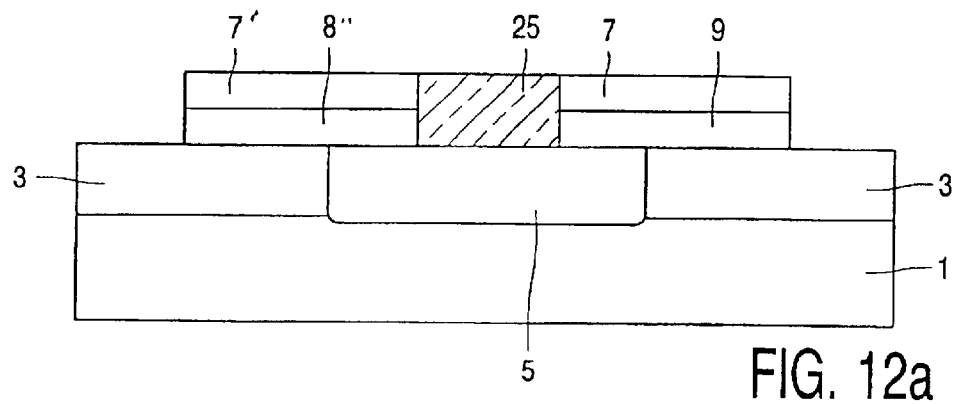
Figure 12B:
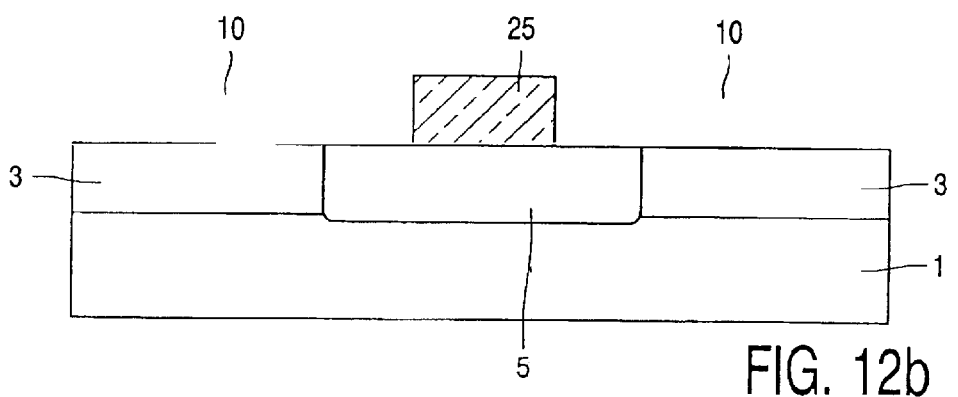
Figure 13A:
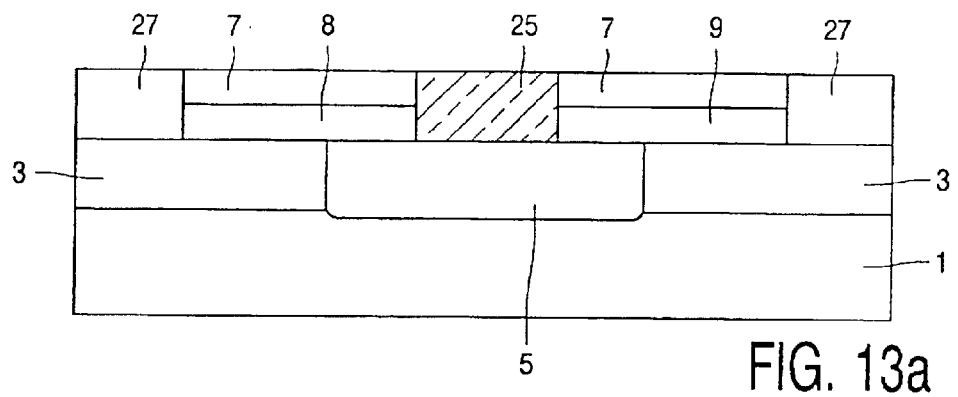
Figure 13B:
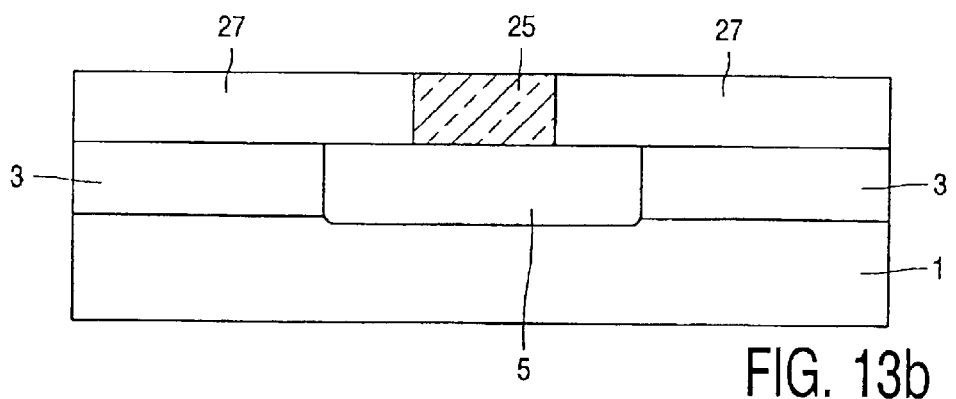
Figure 14A:
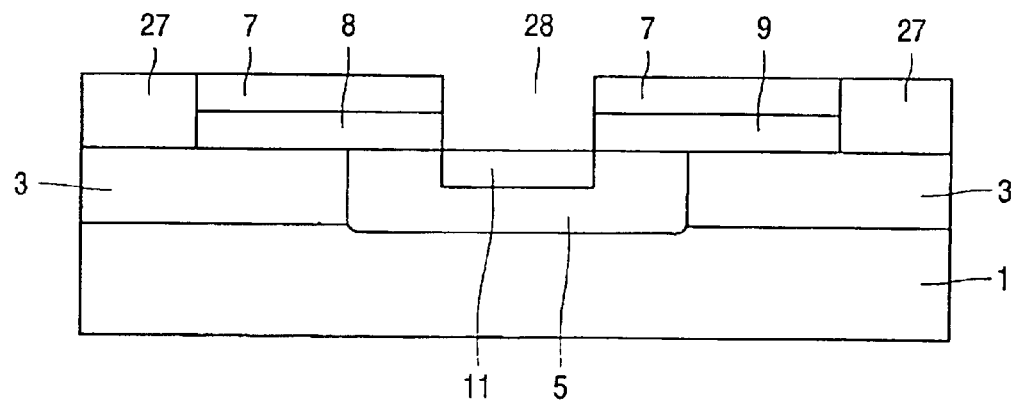
Figure 14B:
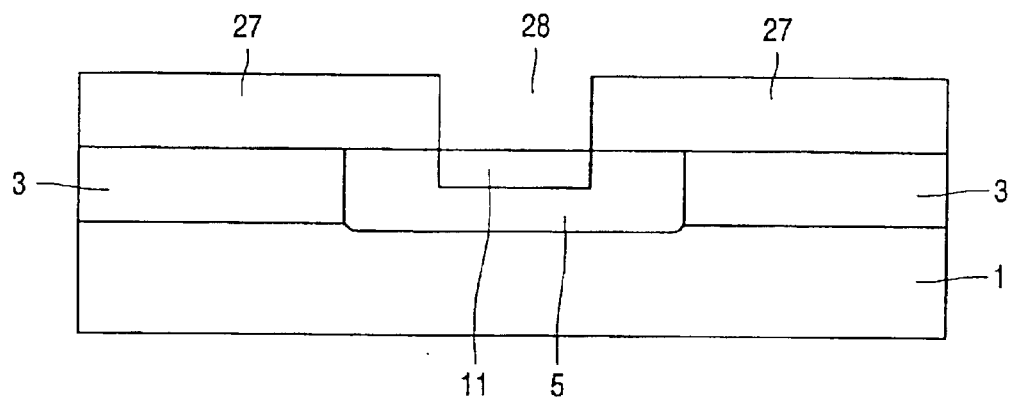
Figure 15A:
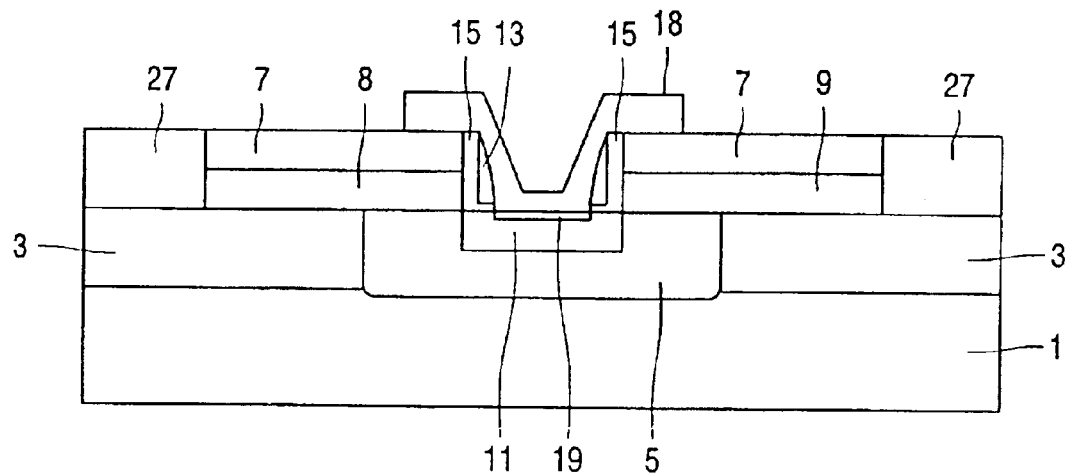
Figure 15B:
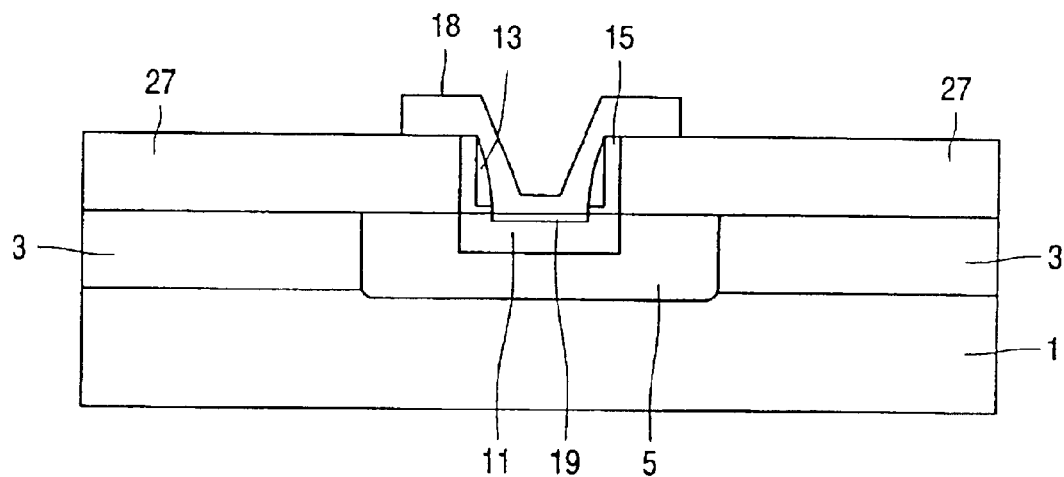

In a following stage, shown in FIG. 12, a comparatively thick oxide layer 27 is provided which is removed down to the level of the plug 25, see FIG. 13, by means of, for example, CMP. The plug 25 can be removed by selective wet-etching, resulting in the formation of the window 28 (see FIG. 14), which is separated from the oxide 3 along the line A—A by the terminals 8 and 9, and along the line B—B by the oxide layer 27. Via this window, the intrinsic p-type base 11 can be provided, for example by implantation of boron ions. In addition, if desired, an n-type implantation can be carried out via the window 28 to locally increase the concentration in the collector. Subsequently, as described in the preceding examples, the emitter-base spacers 13, 15 can be formed, whereafter the n-type emitter 18, 19 is formed in the window 28. Also in this case, the resultant transistor is formed in a single active region, and the transistor comprises an emitter which is separated, in this case by the comparatively thick, planarized oxide layer 27, from the oxide of the island isolation 3 surrounding the active region.

Figure 16A:
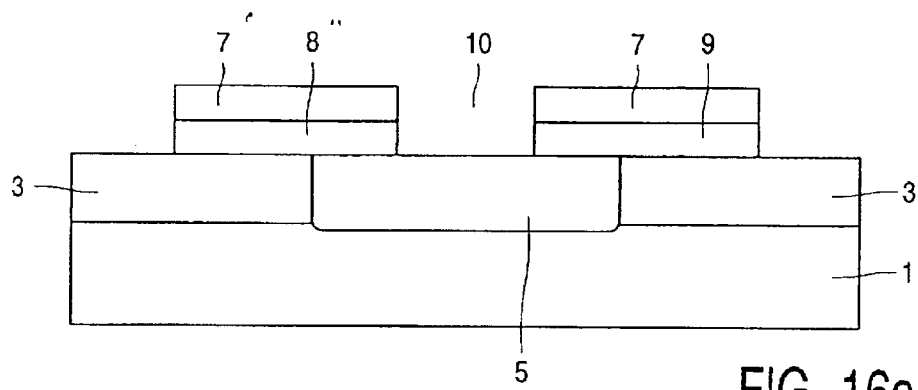
FIGS. 16 through 19 are sectional views of a semiconductor device manufactured by using a modification of the method in accordance with the preceding example.
Figure 16B:
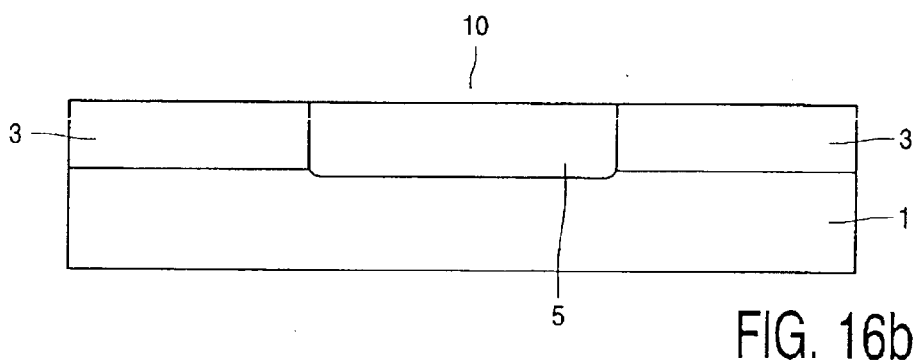
Figure 17A:
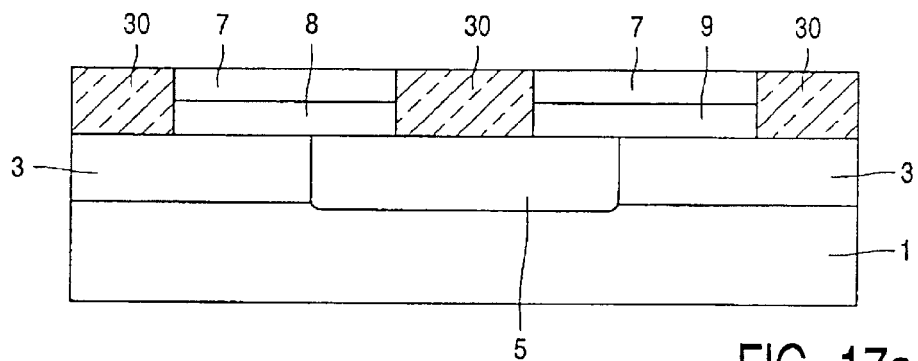
Figure 17B:
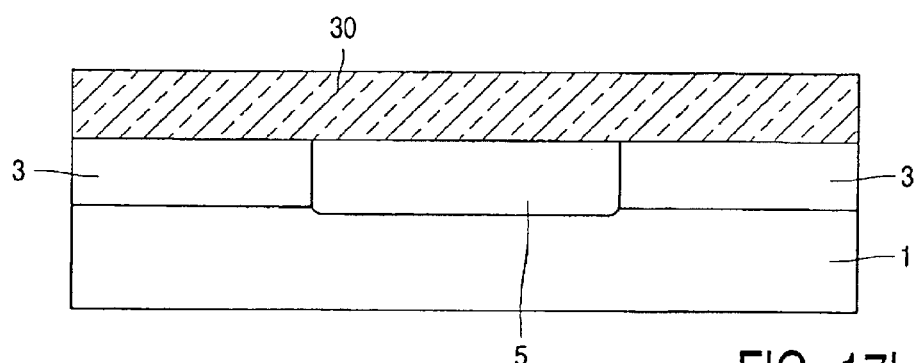
Figure 18A:
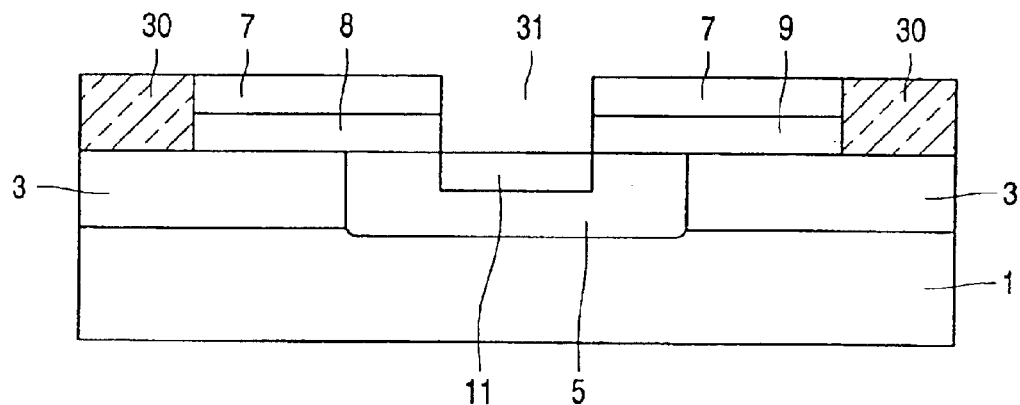
Figure 18B:
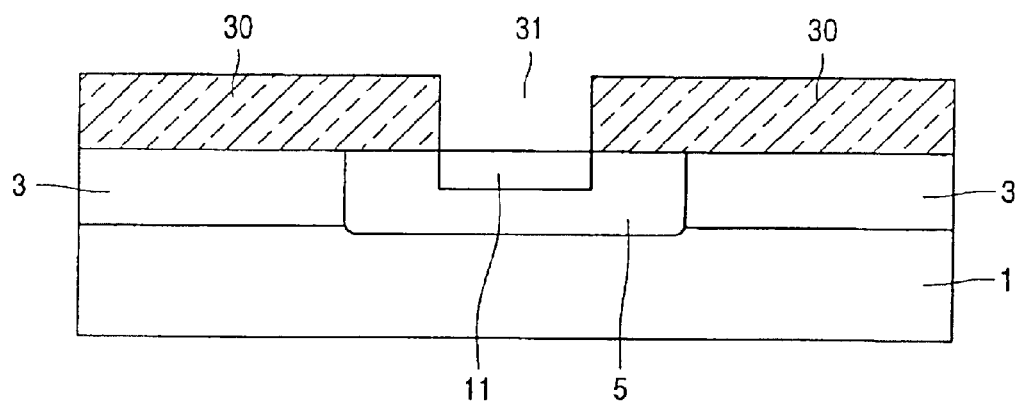
Figure 19A:
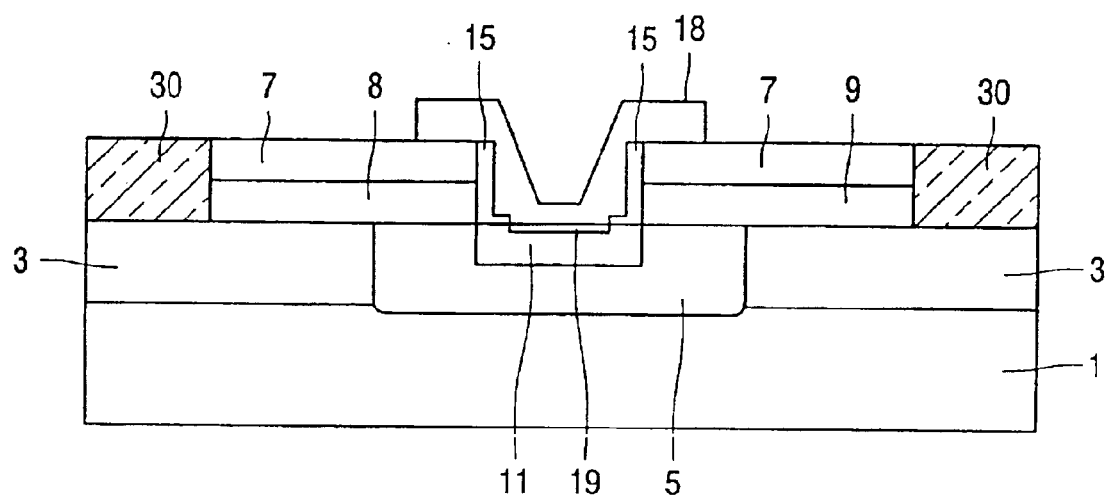
Figure 19B:
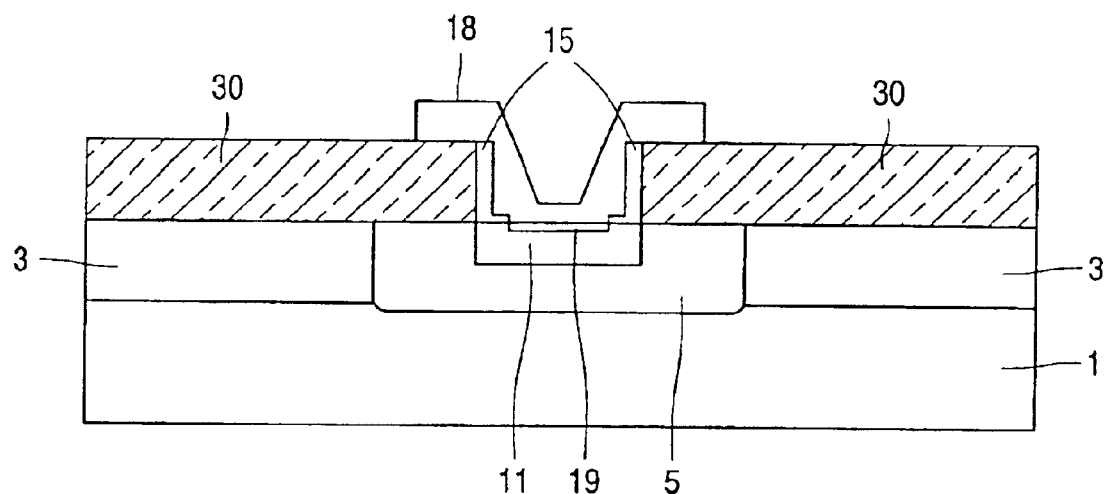

A modification of this method is described with reference to the sectional views of a transistor, whereby FIGS. 16 to 19 show various stages in the production process of said transistor. Also in this case, the island isolation 3 is obtained by means of the above-described "shallow trench isolation" resulting in a flat, or substantially flat, surface. After the n-type and p-type implantations in the poly I layer have been carried out, the p-type base terminal 8 and the n-type collector terminal 9, which are mutually separated by an intermediate region 10, are, unlike the preceding example, directly formed from the poly I layer (FIG. 16). Next, the whole is covered with a comparatively thick layer 30 of a material which can be selectively etched with respect to the silicon oxide layer 7; in this case, the layer 30 includes silicon nitride. The layer 30 is removed down to the level of the oxide layer 7, see FIG. 17, by means of CMP. By means of a mask, the base region is subsequently defined, after which the silicon nitride is etched from the layer 30 at the location of the (intrinsic) base region to be formed, resulting in the window 31 (FIG. 18). Along the line A—A in FIG. 10, the window 31 is bounded by the poly-oxide layers 7, 8 and 7, 9, and along the line B—B, said window is bounded by the nitride layer 30; it is noted that, in both directions, the window 31 is situated at a distance from the isolation 3. The mask used in the formation of the window 31 may overlap the oxide layer 7 above the base and collector terminals 8 and 9 since the nitride is selectively etched with respect to oxide. Via the window 31, the intrinsic base 11 can be provided by implantation of boron ions. Also in this case, if desired, the concentration of the collector below the base 11 can be increased by implantation of n-type ions. In a next stage, the edges of the window 31 are provided with the base-emitter spacers 15, after which the n-type poly layer 18, which forms the emitter terminal, and the n-type emitter 19 are provided. Also in this case, the resultant transistor is formed in a single active region 5, contains two layers of poly and is provided with an emitter which is laterally separated from the island isolation 3.

It will be obvious that the invention is not limited to the examples described hereinabove, and that, within the scope of the invention, many variations are possible to those skilled in the art. For example, the emitter can be embodied so as to comprise a number of adjacent fingers with intermediate base fingers. Apart from npn-transistors, the method in accordance with the invention also enables pnp-transistors to be manufactured. Furthermore, the invention cannot only be used for the manufacture of discrete transistors, but it can also be employed in bipolar IC processes or in BICMOS processes.

What is claimed is:

1. A method of manufacturing a semiconductor device comprising the steps of:

providing a semiconductor body, at a surface, with an isolation region which is recessed in the semiconductor, defining a continuous active region in the semiconductor body by the isolation region, forming a transistor having, adjacent to the surface, emitter and collector regions of a first conductivity type and a base region of the opposite, second conductivity type providing said emitter, base and collector regions with a contact region by depositing a first silicon layer on the surface, from which silicon layer two of said three contact regions are formed, which are mutually separated by an intermediate region, removing the first semiconductor layer, which intermediate region extends transversely over the length of the active region, depositing a second silicon layer which is electrically insulated from the first silicon layer, and forming the third contact region from which second silicon layer at the location of the intermediate region between the two contact regions characterized in that the, method includes the steps of:

doping a first contact region of the two contact regions formed from the first semiconductor layer, which is connected to the collector region, with an impurity of the first conductivity type, and doping a second contact region, which is connected to the base region, with an impurity of the second conductivity type, the semiconductor body being doped, after the removal of the first semiconductor layer in the intermediate region, at the location of said intermediate region with an impurity of the second conductivity type to form a part of the base region which forms an intrinsic base region, after which the second semiconductor layer is deposited, from which the emitter contact and the emitter region of the first conductivity type are formed, and in a stage after the first semiconductor layer has been removed at the location of the intermediate region and before the second semiconductor layer is deposited, strips of an electrically insulating material separating the emitter region from the isolation region are formed at two opposite sides of the active region at the location where the intermediate region between the base contact and the collector contact is adjacent to the isolation region.

2. A method as claimed in claim 1, characterized in that, prior to the deposition of the first semiconductor layer, the active region, which forms the collector of the transistor, is doped with a doping of the first conductivity type.

3. A method as claimed in claim 1, characterized in that after the formation of the intrinsic base region, a layer of an electrically insulating material is provided, which is subjected to an etching operation so as to form spacers on edges of the base contact and the collector contact, causing these contacts to be electrically insulated from the emitter contact to be formed in a subsequent stage of the production process.

4. A method as claimed in claim 3, characterized in that the spacers are embodied so as to be L-shaped.

5. A method as claimed in claim 3, characterized in that during the etching operation, parts of the layer of electrically insulating material are protected against etching by a mask in the intermediate region at the location where this intermediate region adjoins the isolation region, so that said strips of electrically insulating material separating the emitter region from the isolation region are formed by etching.

6. A method as claimed in claim 1, characterized in that the doping step carried out to form the intrinsic base region is performed prior to the provision of said strips of electrically insulating material.

7. A method as claimed in claim 1, characterized in that, if use is made of a semiconductor body of silicon, the surface of the active region is covered at the location of the intermediate region with a masking layer to form said strips of electrically insulating material, which masking layer protects the surface against oxidation and can be selectively etched with respect to silicon oxide, and said masking layer leaves parts of the active region, where strips must be formed, exposed, after which said exposed parts of the active region are provided, by means of oxidation, with a silicon oxide layer, whereafter the masking layer is removed by selective etching.

8. A method as claimed in claim 7, characterized in that the isolation region surrounding the active region is formed by means of a masked oxidation step, wherein the active region is protected against oxidation by an oxidation mask and the unprotected region around the active region is converted to a pattern of silicon oxide which is at least partly recessed in the semiconductor body, and in a next stage of the manufacturing process, the active region is provided with said strips of silicon oxide whose thickness is smaller than that of the silicon oxide in the isolation region.

9. A method as claimed in claim 6, characterized in that, after the formation of the base contact and the collector contact, the whole is covered with a layer of an electrically insulating material from which said strips of an electrically insulating material are formed in said intermediate region by etching using a mask, after which the intrinsic base region is formed in the exposed part of the intermediate region.

10. A method as claimed in claim 4, characterized in that, before the intermediate region is defined, the semiconductor layer is covered with a dielectric layer, after which a window is formed in the dielectric layer and the first semiconductor layer, which window defines the intrinsic base region to be formed and is subsequently filled with a material which can be selectively etched with respect to the dielectric layer and the layer of an electrically insulating material to be provided hereafter, after which an etching process is carried out to form the base contact and the collector contact from the first semiconductor layer as well as the intermediate region situated between these contacts, whereafter a layer of an electrically insulating material is provided over the whole, which covers the intermediate region outside the intrinsic base region and which forms said strips of electrically insulating material along the edges of the active region, after which said material provided above the intrinsic base region is removed by means of selective etching, and the intrinsic base and the emitter are formed via the window thus obtained.

11. A method as claimed in claim 4, characterized in that the first semiconductor layer is covered with a dielectric layer, after which the base contact, the collector contact and the intermediate region situated between these contacts are formed, whereafter, in a next stage, a layer is provided of a material which can be selectively etched with respect to the dielectric layer, and which fills the intermediate region while leaving the base contact and the collector contact exposed, after which an opening is formed in this layer by means of selective etching, which opening defines the intrinsic base region and is situated at a distance from the edges of the active region, after which the intrinsic base region and the emitter of the transistor are provided via this opening.

* * * * *